United States Patent
Park

(10) Patent No.: US 10,454,003 B2
(45) Date of Patent: Oct. 22, 2019

(54) LIGHT EMITTING DEVICE AND MANUFACTURING METHOD THEREOF

(71) Applicant: LG INNOTEK CO., LTD., Seoul (KR)

(72) Inventor: Bo Geun Park, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 126 days.

(21) Appl. No.: 15/637,774

(22) Filed: Jun. 29, 2017

(65) Prior Publication Data

US 2017/0301836 A1    Oct. 19, 2017

Related U.S. Application Data

(63) Continuation of application No. 14/473,856, filed on Aug. 29, 2014, now Pat. No. 9,735,324, which is a (Continued)

(30) Foreign Application Priority Data

Sep. 4, 2006  (KR) .................. 10-2006-0084901

(51) Int. Cl.
*H01L 33/00* (2010.01)
*H01L 33/54* (2010.01)
(Continued)

(52) U.S. Cl.
CPC .............. *H01L 33/54* (2013.01); *H01L 33/30* (2013.01); *H01L 33/507* (2013.01); *H01L 33/58* (2013.01);
(Continued)

(58) Field of Classification Search
CPC ....... H01L 2933/005; H01L 2933/0058; H01L 33/30; H01L 33/507; H01L 33/54; H01L 33/58; H01L 33/62
See application file for complete search history.

(56) References Cited

U.S. PATENT DOCUMENTS 7,553,683 B2   6/2009 Martin et al.
7,675,075 B2   3/2010 Nagai
(Continued)

FOREIGN PATENT DOCUMENTS

KR   10-2006-0036937 A   5/2006
WO   WO 2006/006544 A1   1/2006

OTHER PUBLICATIONS

English translation of KR-10-2006-0036937-A dated May 3, 2006.

*Primary Examiner* — Meiya Li
(74) *Attorney, Agent, or Firm* — Birch, Stewart, Kolasch & Birch, LLP

(57) ABSTRACT

A light emitting device includes a substrate including an entire top surface that is flat; a light emitting diode on the substrate; a lead frame formed on the flat top surface of the substrate, the lead frame electrically connected to the light emitting diode; a dam member disposed on the lead frame and being adjacent to the light emitting diode, the dam member having a circular configuration which has an opening; a first member disposed on the light emitting diode, the first member including a fluorescent substance to convert a light emission spectrum of light from the light emitting diode; a second member disposed in the opening of the dam member, a circumference of the second member being defined by the dam member and contacting an inner vertical side surface of the dam member, wherein the second member excludes the fluorescent substance; and a lens disposed on the second member.

18 Claims, 4 Drawing Sheets

Related U.S. Application Data continuation of application No. 11/849,097, filed on Aug. 31, 2007, now Pat. No. 8,853,730.

(51) Int. Cl.
  *H01L 33/30* (2010.01)
  *H01L 33/50* (2010.01)
  *H01L 33/58* (2010.01)
  *H01L 33/62* (2010.01)

(52) U.S. Cl.
  CPC .... *H01L 33/62* (2013.01); *H01L 2224/48091* (2013.01); *H01L 2224/49107* (2013.01); *H01L 2933/005* (2013.01); *H01L 2933/0058* (2013.01)

(56) References Cited

U.S. PATENT DOCUMENTS

| | | |
|---|---|---|
| 2002/0145152 A1 | 10/2002 | Shimomura |
| 2004/0079957 A1 | 4/2004 | Andrews et al. |
| 2004/0207999 A1* | 10/2004 | Suehiro ................ G02B 6/0018 362/84 |
| 2005/0218421 A1 | 10/2005 | Andrews et al. |
| 2006/0001361 A1 | 1/2006 | Imai et al. |
| 2006/0063287 A1 | 3/2006 | Andrews |
| 2007/0102722 A1 | 5/2007 | Ishizaka et al. |
| 2008/0007939 A1 | 1/2008 | Lee et al. |
| 2008/0023711 A1* | 1/2008 | Tarsa .................... H01L 33/486 257/98 |
| 2008/0026498 A1 | 1/2008 | Tarsa et al. |
| 2008/0079017 A1 | 4/2008 | Loh et al. |

* cited by examiner

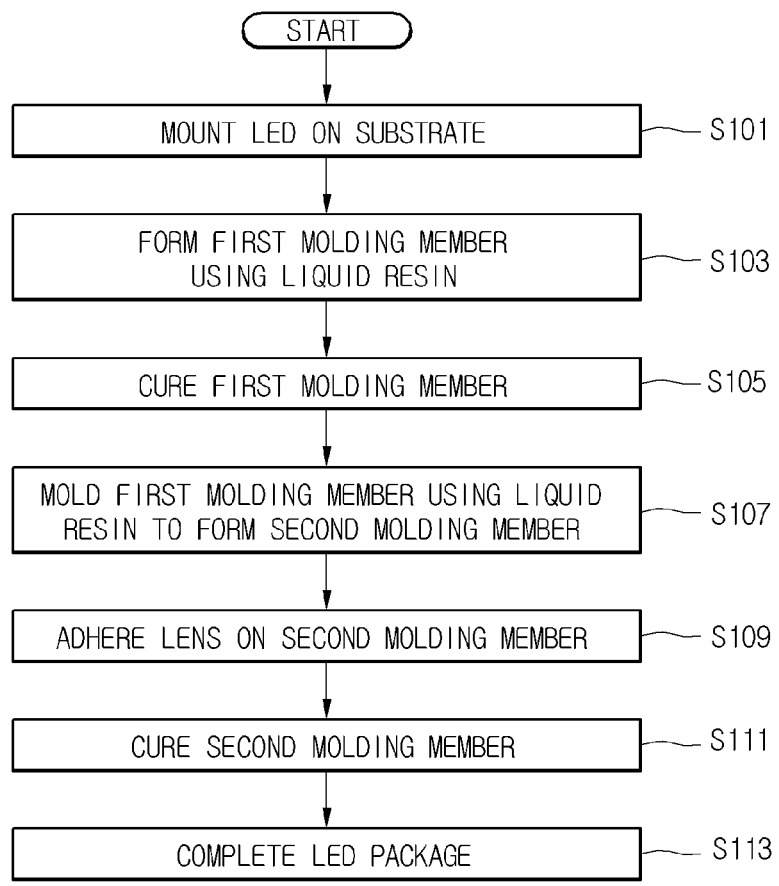

LIGHT EMITTING DEVICE AND MANUFACTURING METHOD THEREOF

CROSS-REFERENCE TO RELATED APPLICATIONS

This Application is a Continuation of co-pending U.S. patent application Ser. No. 14/473,856 filed on Aug. 29, 2014, which is a Continuation of U.S. patent application Ser. No. 11/849,097 filed on Aug. 31, 2007 (now U.S. Pat. No. 8,853,730 issued on Oct. 7, 2014), which claims the benefit under 35 U.S.C. § 119(a) to Korean Patent Application No. 10-2006-0084901 filed on Sep. 4, 2006, all of which are hereby expressly incorporated by reference into the present application.

BACKGROUND

Embodiments relates to a light emitting device and manufacturing method thereof.

LEDs (Light Emitting Diodes) constitute a light emission source by using GaAs, AlGaAs, GaN, InGaN or InGaAlP-based compound semiconductor materials, thereby producing various colors.

Such LEDs have been packetized and used as light emission devices. Further, the LEDs have been used as light sources in various fields such as a lightening indicator, a character indicator and an image indicator.

SUMMARY

The embodiment provides a light emitting device, in which an LED (light emitting diode) is sealed by a molding member having a double sealing structure, and a manufacturing method thereof.

The embodiment provides a light emitting device, in which a lens adheres before a molding member having a double sealing structure is cured and thus the lens can be adhered with stability, and a manufacturing method thereof.

The embodiment provides a light emitting device comprising: a substrate; a light emitting diode on the substrate; a molding member sealing the light emitting diode in a double sealing structure and comprising a flat upper surface.

The embodiment provides a light emitting device comprising: a substrate; a light emitting diode on the substrate; a first molding member sealing the light emitting diode; a second molding member on the first molding member; and a lens adhering on the second molding member.

The embodiment provides a method for manufacturing a light emitting device, the method comprising the steps of: mounting a light emitting diode on a substrate; sealing the light emitting diode by using a molding member comprising a double sealing structure; and adhering a lens onto the molding member and curing the molding member.

BRIEF DESCRIPTION OF THE DRAWINGS

FIG. 7 is a flow diagram showing the procedure for manufacturing a light emitting device according to an embodiment.

DETAILED DESCRIPTION OF THE EMBODIMENTS

Hereinafter, a light emitting device according to an embodiment will be described in detail with reference to the accompanying drawings.

Figure 1:
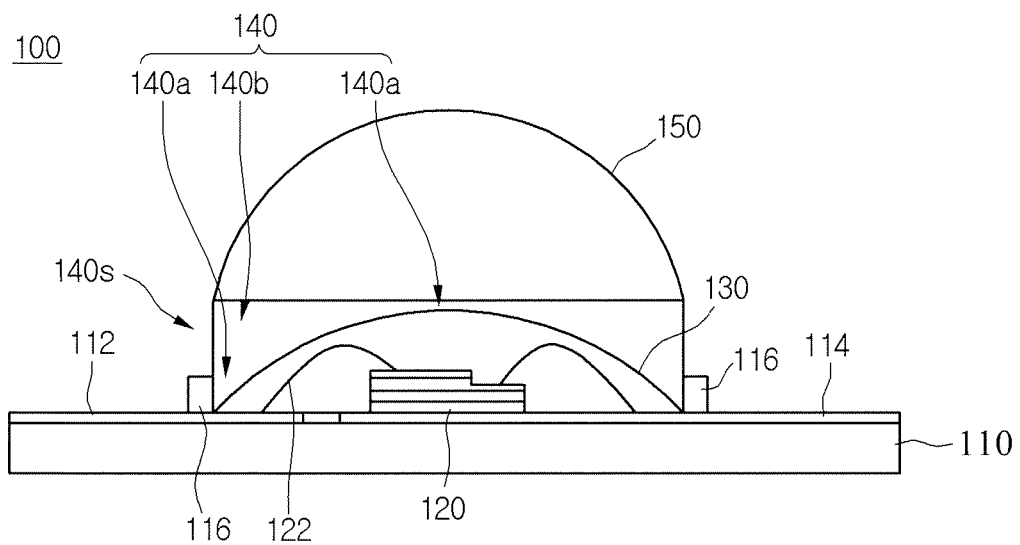
FIG. 1 is a side sectional view showing a light emitting device according to a first embodiment.

FIG. 1 is a side sectional view showing a light emitting device according to a first embodiment.

Referring to FIG. 1, the light emitting device 100 comprises a substrate 110, a LED 120, a first molding member 130, a second molding member 140 and a lens 150.

The substrate 110 comprises a material such as a MCPCB (Metal Core Printed Circuit Board), a FR-4, and a CEM (Composite Epoxy materials grade) PCB. Further, the substrate 110 may also be formed in the form of a COB (chip on board).

Multiple lead frames 112 and 114 are formed on the substrate 110. The lead frames 112 and 114 are electrically opened to each other and electrically connected to the LED 120. Reflective material such as Ag and Al can also be coated on or attached to the surfaces of the lead frames 112 and 114.

The LED 120 is fixed to any one of the lead frames 112 and 114, and is connected to each lead frame 112 and 114 through a wire 122. The LED 120 can be connected the lead frames 112 and 114 through one wire or in a flip manner. However, the embodiment is not limited thereto.

The LED 120 can be realized selectively using GaAs, AlGaAs, GaN, InGaN and/or InGaAlP-based compound semiconductor materials. Further, the LED 120 can comprise at least one of red, green and blue LED chips.

A dam part 116 is formed on the substrate 110. The dam part 116 can be formed on the substrate 110 in the form of a dam or a bank having a circular configuration or a polygonal loop configuration by using a non-conductive material such as resin. For example, the substrate 110 may include a flat top surface. The dam part 116 may be disposed on the lead frames 112 and 114 and may comprise a portion having a circular configuration or a polygonal loop configuration. The portion of the dam part 116 may surround the light emitting diode 120 and have an opening in which the light emitting diode 120 may be disposed.

The molding members 130 and 140 seal the LED 120 in a double sealing structure. Such molding members 130 and 140 are formed in the form of a circular column or a polygonal column in the inner side of the dam part 116. A circumference of the second molding member 140 is defined by the dam part 116. The circumference of the second molding member 140 contacts a side surface of the dam part 116. A portion of the dam part 116 includes a vertical inner surface that contacts a vertical outer surface 140s of the second molding member 140. For example, as shown in FIG. 1, an inner side surface of the dam part 116 may contact a first portion 140a of the second molding member 140 and be perpendicular to the flat top surface of the substrate 110. The first portion 140a of the second molding member 140 may contact the lead frames 112 and 114, and be provided along a top surface of the first molding member 130. The first portion 140a of the second molding member 140 and the first molding member 130 may be horizontally overlapped. The second molding member 140 may include a second portion 140b extending from the first portion 140a of the second molding member 140 disposed on an uppermost portion of the top surface of the first molding member 130 along the bottom surface of the lens 150. The second molding member 140 may include the vertical outer surface 140s being parallel with the side surface of the dam part 116 and downwardly extended from a circumference of the bottom surface of the lens 150. A height from a lowermost portion of the vertical outer side surface 140s of the second molding member 140 to an uppermost portion of the vertical outer side surface 140s of the second molding member 140 is larger than a height from a lowermost portion of a bottom surface of the first molding member 130 to the uppermost portion of the top surface of the first molding member 130.

The first molding member 130 is formed on and around the LED 120 and the second molding member 140 is formed on the first molding member 130. The first and second molding members 130 and 140 can comprise resin such as epoxy or silicone or material similar to the resin.

The first molding member 130 is formed in the form of a convex lens. The second molding member 140 is formed on the first molding member 130 in the form of a circular column or a polygonal column, and has a flat upper surface. A curvature of a top surface of the first molding member 130 and a curvature of a top surface of the second molding member 140 are different from each other. The curvature of the top surface of the second molding member 140 and a curvature of a top surface of the lens 150 are different from each other.

The first molding member 130 seals the LED 120, the wire 122 and a bonding region. The wire 122 may also be sealed in the first molding member 130 or the second molding member 140.

A fluorescent substance can be added to at least one of the first and second molding members 130 and 140. For instance, a fluorescent substance 170 can be added to the first molding member 130. For example, a yellow fluorescent substance that emits a yellow light by converting a part of a blue light of a blue LED chip into the yellow light may also be added.

First and second fluorescent substances may be added to the first molding member 130 and/or the second molding member 140, respectively. The first and second fluorescent substances may be fluorescent substances having similar light emitting spectrums, i.e. yellow fluorescent substances. Further, the first and second fluorescent substances may be fluorescent substances having different light emission spectrums, i.e. a red fluorescent substance and a green fluorescent substance. Such fluorescent substances may comprise red, yellow, green and blue fluorescent substances. The embodiment is not limited thereto.

The first molding member 130 can be formed using liquid resin of about 0.01 g, and the second molding member 140 can be formed using liquid resin of about 0.02 g to 0.04 g. That is, the second molding member 140 has a volume larger than that of the first molding member 130.

The second molding member 140 may comprise material identical to that of the lens 150, or material such as resin (e.g. epoxy, silicone and phenyl) having optical (refractive index), physical and chemical characteristics similar to the lens 150.

The lens 150 adheres onto the second molding member 140. The lens 150 has hemispherical shape and integrally adheres to the flat upper surface of the second molding member 140. Such a lens 150 is integrally adhered to the second molding member 140 without using an additional adhesion member when the second molding member 140 is cured. An area of a top surface of the second molding member 140 and an area of a bottom surface of the lens 150 are the same. The lens 150 may also comprise a hemispherical convex shape or a lens having a concave-convex shape formed thereon. The embodiment is not limited thereto. A height from a lowermost portion of the bottom surface of the lens 150 to an uppermost portion of the top surface of the lens 150 is larger than a height from a lowermost portion of the bottom surface of the first molding member 130 to an uppermost portion of the top surface of the first molding member 130 or from a lowermost portion of the bottom surface of the second molding member 140 to an uppermost portion of the top surface of the second molding member 140.

As described above, the optical characteristics of the lens 150 may not be degraded by considering the physical and optical characteristics of the second molding member 140 and the lens 150. Further, the lens 150 can be firmly adhered to the second molding member 140.

FIGS. 2 to 5 are sectional views showing the procedure for manufacturing the light emitting device according to the first embodiment.

Figure 2:
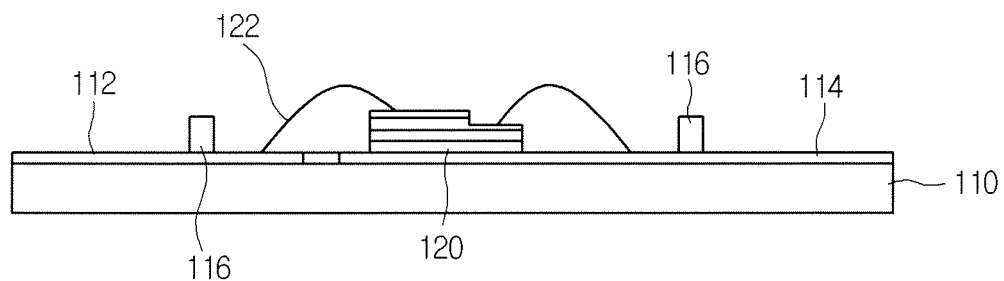
FIGS. 2 to 5 are sectional views showing the procedure for manufacturing a light emitting device according to a first embodiment.

Referring to FIG. 2, the LED 120 is fixed to the lead frame 114 on the substrate 110 and is connected to the lead frames 112 and 114 through the wire 122.

The dam part 116 is formed on the lead frame 114 and around the LED 120. The dam part 116 is formed on the substrate 110 in the form of a dam or a bank having a circular configuration or a polygonal loop configuration by using non-conductive material such as resin.

Figure 3:
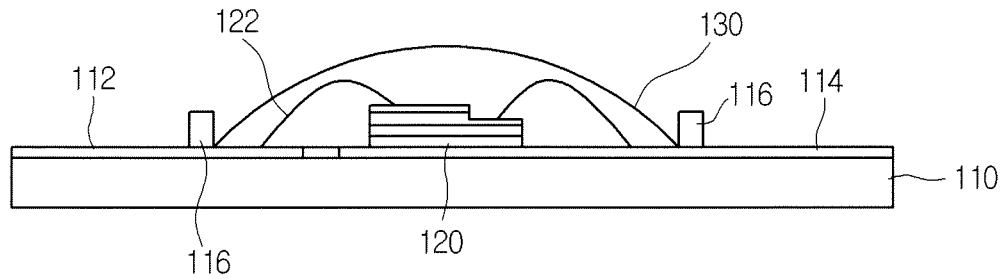

Referring to FIG. 3, the first molding member 130 is dispensed on and around the LED 120. At this time, the first molding member 130 has a convex lens shape in the inner side of the dam part 116.

A predetermined amount (e.g. 0.01 g) of the first molding member 130 comprising liquid resin such as epoxy or silicone is dispensed, thereby sealing the LED 120 and the peripheral area of the LED 120. The first molding member 130 is cured using a thermosetting method. At this time, the thermosetting temperature is resin curing temperature. For example, the first molding member 130 is heated at the temperature of about 150° C.

The first dispensed molding member 130 is formed in the inner side of the dam part 116 to seal the LED 120, the wire 122 and the wire bonding region.

Figure 4:
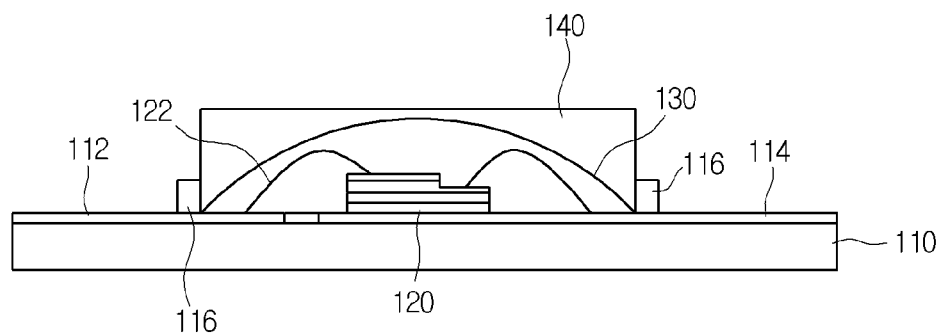

Referring to FIG. 4, the second molding member 140 is molded on the first molding member 130. The second molding member 140 is molded after the first molding member 130 is cured, so that bubbles can be prevented from being formed between the first molding member 130 and the second molding member 140.

The second molding member 140 is molded on the first molding member 130 by using a predetermined amount (e.g. 0.02 g to 0.04 g) of liquid resin. The second molding member 140 may comprise material the same as that of the first molding member 130, e.g. resin such as epoxy or silicone.

The second molding member 140 is formed in the inner side of the dam part 160, is formed in the form of a circular column or a polygonal column, and has a flat upper surface. Such first and second molding members 130 and 140 can selectively use a dispensing molding method using a syringe, an insert molding method or a transfer molding method.

Further, a fluorescent substance (not shown) may be added to at least one of the first and second molding members 130 and 140. For example, at least one of yellow, red, blue and green fluorescent substances may be added to the first molding member 130 or/and the second molding member 140. The embodiment is not limited thereto.

Figure 5:
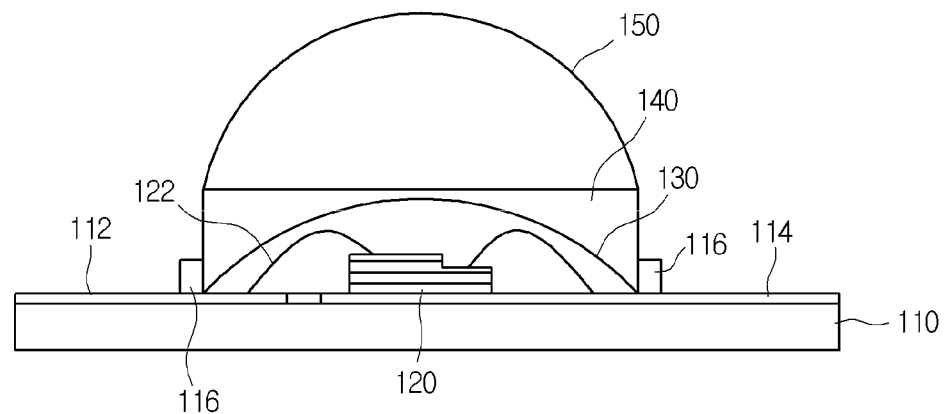

Referring to FIG. 5, the lens 150 having a hemispherical shape is adhered onto the second molding member 140. The lens 150 is integrally adhered onto the second molding member 140. To this end, the lens 150 is safely seated to the flat upper surface of the second molding member 140 before the second molding member 140 is cured, and then the second molding member 140 is cured. The curing temperature of the second molding member 140 is resin curing temperature, e.g. about 150° C.

Then, the lens 150 is integrally fixed on the second molding member 140, thereby completing fabrication of the light emitting diode package. Further, the lens 150 is adhered on the second molding member 140 with structural stability, so that that the lens 150 can be firmly attached to the second molding member 140 and the optical characteristics of the lens 150 may not be degraded when the lens 150 is used.

The upper surface of the second molding member 140 and the bottom surface of the lens 150 may have the same area or different areas. For example, the upper surface of the second molding member 140 may have a diameter larger than that of the bottom surface of the lens 150. Further, the second molding member 140 may use material having optical, physical and chemical characteristics the same as or similar to those of the lens 150.

Figure 6:
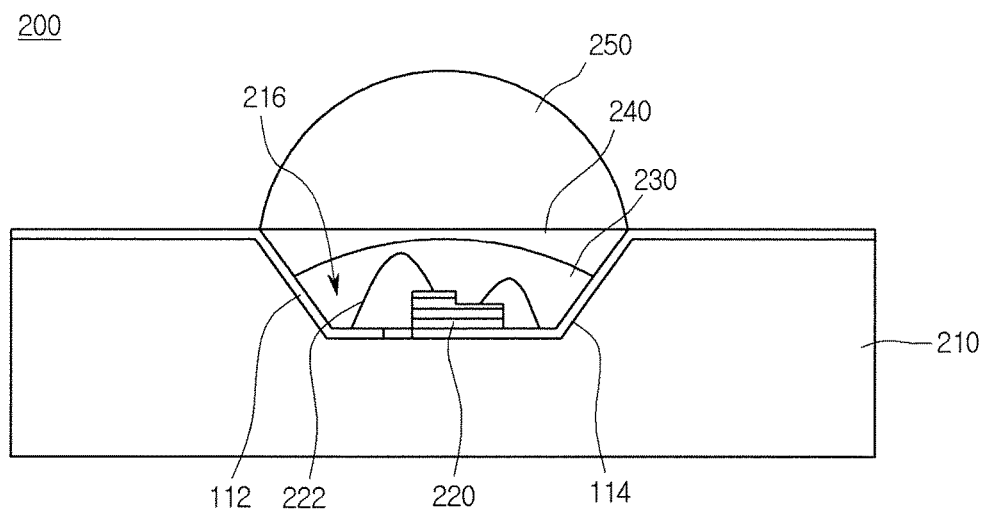
FIG. 6 is a side sectional view showing a light emitting device according to a second embodiment.

FIG. 6 is a side sectional view showing a light emitting device according to a second embodiment.

Referring to FIG. 6, the light emitting device 200 comprises a substrate 210 having a groove 216, a first lead frame 112, a second lead frame 114, a LED 220, a first molding member 230, a second molding member 240 and a lens 250.

The groove 216 formed on the substrate 210 may have a circular shape or a polygonal shape and can be formed through injection molding. However, the embodiment is not limited thereto.

The first and second lead frames 112 and 114 are electrically opened in the groove 216, and the LED 220 is mounted on the second lead frame 114 in the groove 216. The first and second lead frames 112 and 114 are slantingly formed along the inner peripheral surface of the groove 216, and reflective material, e.g. Ag or Al, may also be coated on the surfaces of the first and second lead frames 112 and 114.

The first molding member 230 is dispensed on the groove 216 and then cured. Then, the second molding member 240 is dispensed on the first molding member 230. The upper surface of the second molding member 240 is flat, and the flat upper surface is formed on the same plane with the upper surface of the substrate 210. As described above, the second molding member 240 is formed after the first molding member 230 is cured, so that bubbles can be prevented being formed between the first molding member 230 and the second molding member 240.

The first molding member 230 and the second molding member 240 comprise liquid resin such as epoxy or silicone, and are cured using a thermosetting method at the temperature of about 150° C. The second molding member 240 may have amount equal to or greater than that of the first molding member 230. For example, the amount of the second molding member 240 is at least twice the amount of the first molding member 230.

The first and second molding members 230 and 240 can be molded using a dispensing molding method using a syringe, an insert molding method or a transfer molding method.

Further, a fluorescent substance (not shown) may be added to at least one of the first and second molding members 230 and 240. For example, at least one of yellow, red, blue and green fluorescent substances may be added to the first molding member 230 or/and the second molding member 240. The embodiment is not limited thereto.

The lens 250 adheres onto the second molding member 240. The lens 250 has a hemispherical convex shape and adheres onto the upper surface of the second molding member 240. In detail, the lens 250 adheres onto the upper surface of the second molding member 240 during the curing process of the second molding member 240.

As described above, the molding members 230 and 240 are molded on the LED 220 in a double sealing structure, and then the lens 250 integrally adheres onto the upper surface of the second molding member 240, thereby completing fabrication of the light emitting diode package.

FIG. 7 is a flow diagram showing the procedure for manufacturing the light emitting device according to the embodiment.

Referring to FIG. 7, the LED is mounted on the lead frame on the substrate (S101). The substrate may have a flat structure or a groove shape.

Liquid resin is primarily molded on and around the LED to form the first molding member (S103). Such a first molding member uses liquid resin such as epoxy or silicone and is cured at a predetermined temperature (S105).

Liquid resin is secondarily molded on the first molding member to form a second molding member (S107).

At this time, a hemispherical convex lens is adhered onto the flat upper surface of the second molding member before the second molding member is cured (S109). Then, the second molding member is cured at a predetermined temperature (S111), thereby completing fabrication of the LED package (S113).

The second molding member can comprise resin the same as or different from that of the first molding member. Further, since the second molding member can use material having the physical and chemical characteristics the same as or similar to those of the lens, the optical characteristics of the lens may not be degraded when the lens is used. Furthermore, the lens can be fixed with structural stability.

It will be understood that when an element is referred to as being 'on' or "under" another element, it can be directly on/under the element, and one or more intervening elements may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate including a flat top surface;

a light emitting diode on the substrate;
a lead frame formed on the flat top surface of the substrate, the lead frame electrically connected to the light emitting diode;
a dam member disposed on the lead frame and comprising a portion having a circular configuration or a polygonal loop configuration, the portion of the dam member surrounding the light emitting diode and having an opening in which the light emitting diode is disposed;
a first member disposed on the light emitting diode, the first member including a fluorescent substance to convert a light emission spectrum of light from the light emitting diode;
a second member disposed on the first member, a circumference of the second member being defined by the dam member, wherein the second member excludes the fluorescent substance; and
a lens disposed on the second member,
wherein an inner side surface of the dam member contacts a first portion of the second member and is perpendicular to the flat top surface of the substrate,
wherein the first portion of the second member contacts the lead frame and is provided along a top surface of the first member,
wherein the first member is disposed between the light emitting diode and the second member,
wherein the first portion of the second member is disposed between a lowermost portion of a bottom surface of the lens and a top surface of the light emitting diode,
wherein the lowermost portion of the bottom surface of the lens is located higher than the top surface of the light emitting diode and the first portion of the second member,
wherein the second member includes a second portion extending from the first portion of the second member disposed on an uppermost portion of the top surface of the first member along the bottom surface of the lens,
wherein the second member includes a vertical outer side surface being parallel with the inner side surface of the dam member and downwardly extended from a circumference of the bottom surface of the lens, and
wherein a height from a lowermost portion of the vertical outer side surface of the second member to an uppermost portion of the vertical outer side surface of the second member is larger than a height from a lowermost portion of a bottom surface of the first member to the uppermost portion of the top surface of the first member.

2. The light emitting device of claim 1, wherein the second member is disposed between the inner side surface of the dam member and a side surface of the light emitting diode.

3. The light emitting device of claim 2, wherein a height from the top surface of the light emitting diode to an uppermost portion of the top surface of the lens is larger than a length between the inner side surface of the dam member and the side surface of the light emitting diode.

4. The light emitting device of claim 1, wherein the lead frame includes a portion disposed between the flat top surface of the substrate and a bottom surface of the dam member.

5. The light emitting device of claim 1, wherein the lead frame includes an extension portion that extends from the first portion of the second member to a first location outside of an outer edge of the dam member in a first direction.

6. The light emitting device of claim 5, wherein the extension portion of the lead frame does not extend beyond edges of the substrate.

7. The light emitting device of claim 1, wherein a height from the lowermost portion of the bottom surface of the lens to an uppermost portion of a top surface of the lens is larger than the height from the lowermost portion of the bottom surface of the first member to the uppermost portion of the top surface of the first member or from a lowermost portion of a bottom surface of the second member to an uppermost portion of the top surface of the second member.

8. The light emitting device of claim 7, wherein the uppermost portion of the top surface of the lens is vertically overlapped with the light emitting diode.

9. The light emitting device of claim 1, wherein the first member is disposed on the substrate and does not extend beyond the inner side surface of the dam member.

10. The light emitting device of claim 1, wherein the second portion of the second member is disposed on the first portion of the second member.

11. The light emitting device of claim 1, wherein a largest width of the opening of the dam member and a largest width of the second member are the same.

12. The light emitting device of claim 1, wherein the second member is surrounded by the dam member and disposed on the first member, and
wherein the second member contacts the top surface of the first member.

13. The light emitting device of claim 1, wherein the lens comprises a hemispherical convex shape.

14. The light emitting device of claim 1, wherein the lead frame is disposed between the substrate and the dam member such that both the substrate and the dam member are separate from each other.

15. The light emitting device of claim 1, wherein a curvature of a top surface of the second member and a curvature of a top surface of the lens are different from each other.

16. The light emitting device of claim 1, wherein at least one of the first member and the second member comprises epoxy or silicone.

17. A light emitting device, comprising:
a substrate including a flat top surface;
a light emitting diode on the substrate;
a lead frame formed on the flat top surface of the substrate, the lead frame electrically connected to the light emitting diode;
a dam member disposed on the lead frame and comprising a portion having a circular configuration or a polygonal loop configuration, the portion of the dam member surrounding the light emitting diode and having an opening in which the light emitting diode is disposed;
a first member disposed on the light emitting diode, the first member including a fluorescent substance to convert a light emission spectrum of light from the light emitting diode;
a second member disposed in the opening of the dam member, a circumference of the second member being defined by the dam member, wherein the second member excludes the fluorescent substance; and
a lens disposed on the second member,
wherein an inner side surface of the dam member contacts a first portion of the second member and is perpendicular to the flat top surface of the substrate,
wherein the first portion of the second member contacts the lead frame and is provided along a top surface of the first member, wherein the second member includes a second portion extending from the first portion of the second member disposed on an uppermost portion of the top surface of the first member along a bottom surface of the lens, wherein the first portion of the second member and the first member are horizontally overlapped, wherein the second member includes a vertical outer side surface being parallel with the inner side surface of the dam member and downwardly extended from a circumference of the bottom surface of the lens, and wherein a height from a lowermost portion of the vertical outer side surface of the second member to an uppermost portion of the vertical outer side surface of the second member is larger than a height from a lowermost portion of a bottom surface of the first member to the uppermost portion of the top surface of the first member.

18. The light emitting device of claim 17, wherein a largest width of the opening of the dam member and a largest width of the second member are the same.

* * * * *